United States Patent
Groetsch et al.

(10) Patent No.: US 6,254,287 B1
(45) Date of Patent: Jul. 3, 2001

(54) LASER COMPONENT WITH A LASER ARRAY AND METHOD FOR MANUFACTURING THE COMPONENT

(75) Inventors: Stefan Groetsch, Regensburg; Markus Wicke, Lappersdorf; Werner Spaeth, Holzkirchen; Bruno Acklin, Regensburg, all of (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/157,702

(22) Filed: Sep. 21, 1998

(30) Foreign Application Priority Data

Sep. 22, 1997 (DE) ................................ 197 41 712

(51) Int. Cl.[7] ................ G02B 6/36; G02B 6/10
(52) U.S. Cl. .................. 385/89; 385/129; 385/130; 385/132
(58) Field of Search .............. 385/89, 129, 130, 385/132; 359/618, 619, 641

(56) References Cited

U.S. PATENT DOCUMENTS

| | | | |
|---|---|---|---|
| 5,268,978 | 12/1993 | Po et al. | 385/33 |
| 5,808,323 | 9/1998 | Spaeth et al. | 257/88 |
| 5,877,898 | * 3/1999 | Hollemann et al. | 359/619 |

FOREIGN PATENT DOCUMENTS

| | | |
|---|---|---|
| 44 38 368 | 5/1996 | (DE) . |
| 195 11 593 | 10/1996 | (DE) . |
| 195 37 265 | 2/1997 | (DE) . |
| 0 735 397 | 10/1996 | (EP) . |

OTHER PUBLICATIONS

Yamaguchi et al, "Collimation of emissions from a high–power multistripe laser–diode bar with multiprism array coupling and focusing to a small spot", *Optics Letters*, vol. 20, No. 8, Apr. 15, 1995, pp. 898–900.

Yamaguchi et al, "Efficient Nd:YAG laser end pumped by a high–power multistripe laser–diode bar with multiprism array coupling", *Applied Optics*, vol. 35, No. 9, Mar. 20, 1996, pp. 1430–1435.

* cited by examiner

Primary Examiner—Robert H. Kim
Assistant Examiner—Michael P. Stafira
(74) Attorney, Agent, or Firm—Schiff Hardin & Waite

(57) ABSTRACT

A laser component with a laser array and an optical device for shaping the laser beams emitted by the laser array. The optical device comprises a deflection mirror element following the laser array in the beam direction that simultaneously deflects the individual laser beams of the emitted laser array beam from the radiation direction with respectively the same rotational sense parallel to the common plane and perpendicular thereto. The deflection mirror element is composed of a step-shaped light waveguide stack.

15 Claims, 7 Drawing Sheets

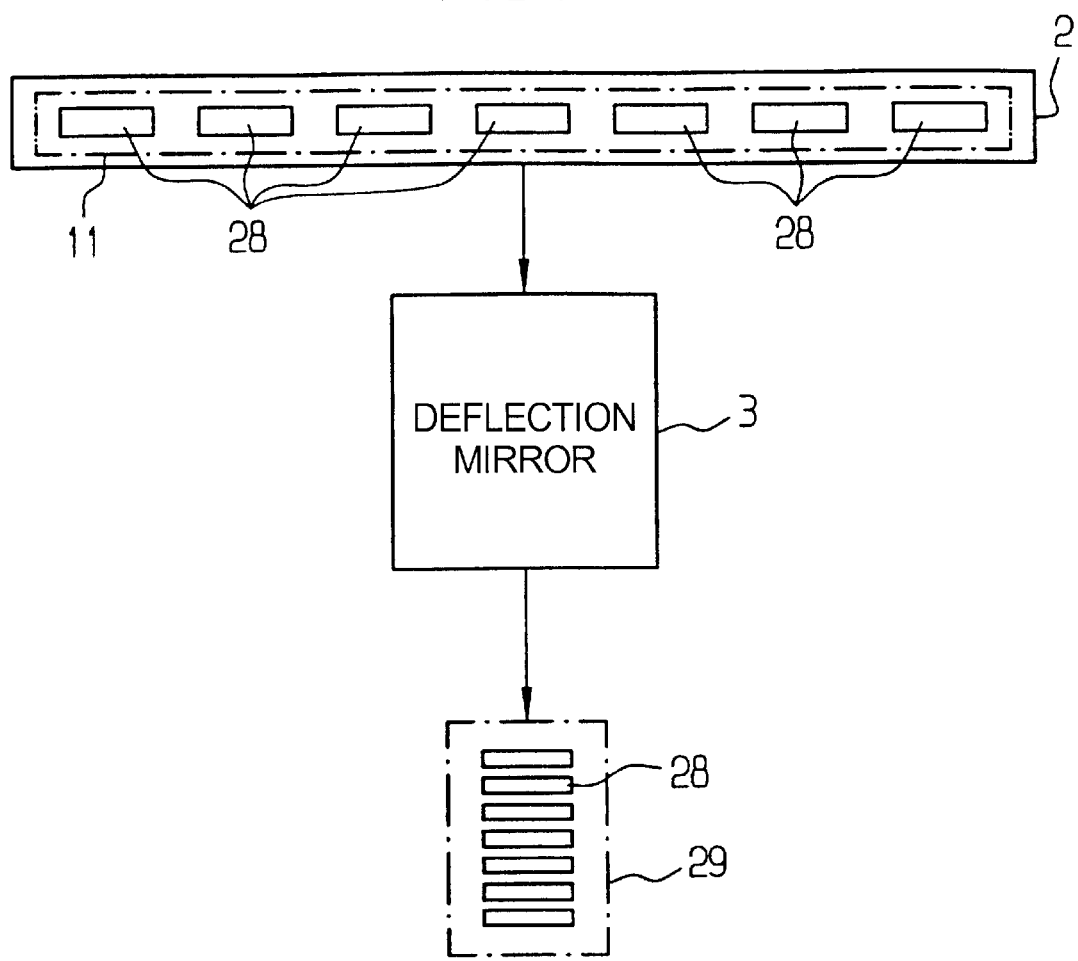

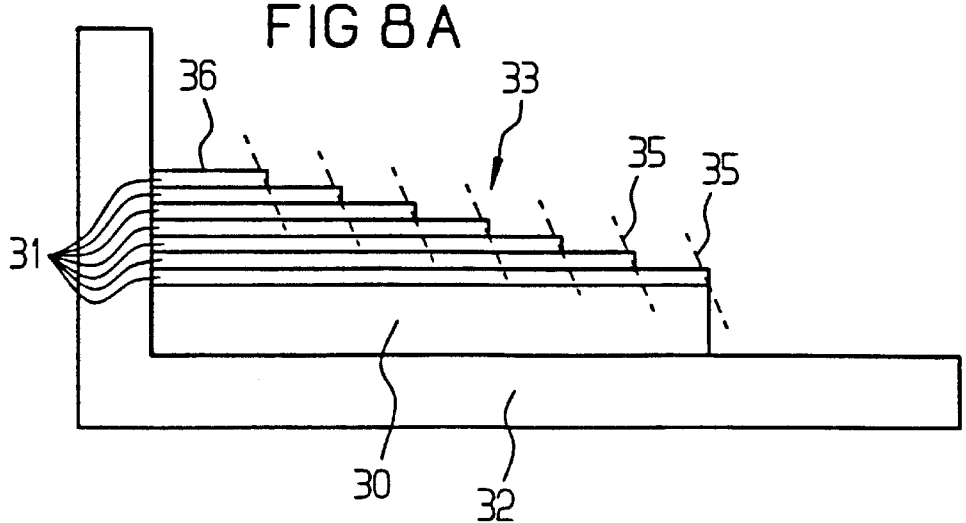
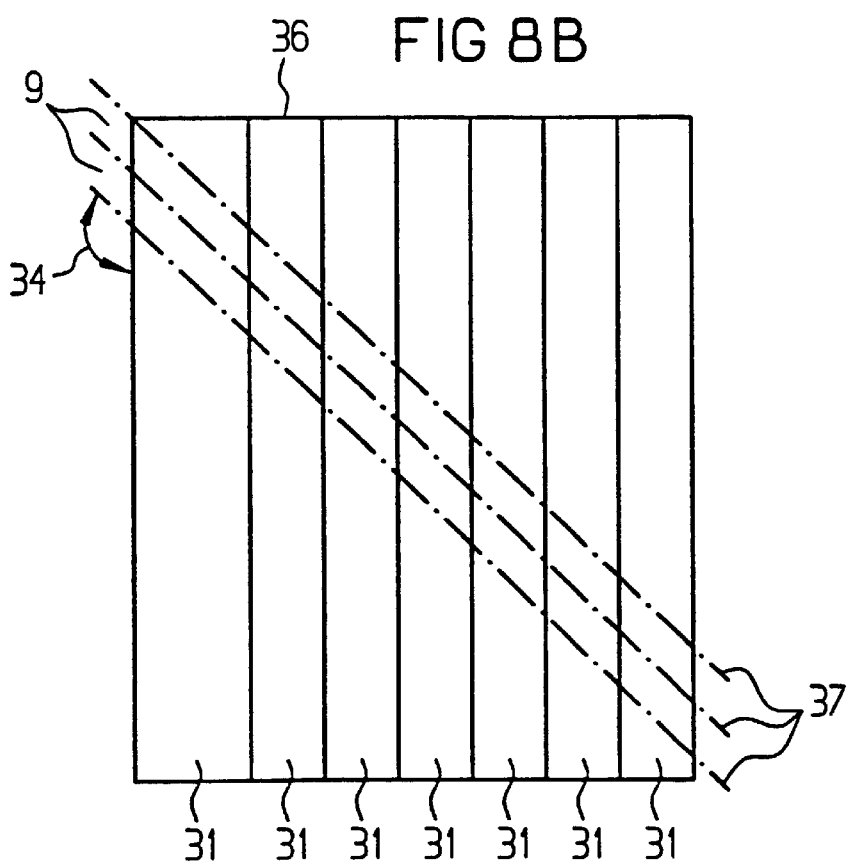

LASER COMPONENT WITH A LASER ARRAY AND METHOD FOR MANUFACTURING THE COMPONENT

BACKGROUND OF THE INVENTION

The present invention is directed to a laser component having at least one laser array and an optical device for shaping laser rays emitted by the laser array, particularly by a laser diode bar that comprises at least two individual laser beams with the same beam direction and with beam axes proceeding essentially parallel to one another and lying in a single common plane and having a first spacing from one another. The optical device comprises a deflection mirror following the laser array in the beam direction that deflects the individual laser beams with the respectively same rotational sense as well as parallel and perpendicular to the common plane.

German 195 11 593 discloses a laser diode bar that is followed in the beam direction by a transparent mirror block fashioned of one piece for shaping the emitted ray beams. The mirror row is composed of a plurality of reflection faces, which are arranged in a common plane, lie parallel to one another and are fashioned in a mirror block. The reflection faces are offset relative to one another perpendicular to the beam direction by the spacing between the individual laser beams. The reflection faces are oblique relative to the beam direction so that they deflect the individual laser beams by 90° parallel to the common plane and, simultaneously, out of this plane at an angle greater than 0°.

The manufacture of such a transparent block requires high precision and is therefore connected with great technological cost. Considerable radiation losses also occur in the mirror block given inadequate precision in the manufacture of the reflection faces.

SUMMARY OF THE INVENTION

The object of the present invention is to develop a laser component of the above-noted type that is technologically simpler to manufacture and simultaneously exhibits comparatively low radiation losses.

This object is achieved by a component having a laser array and an optical device for reordering the laser ray beams emitted from the laser array, which has at least two individual laser beams with the same first radiation direction whose beam axes extend essentially parallel to one another and lie in a single common plane and have a first spacing from one another. The optical device comprises a deflection mirror element following the laser array in the radiation direction that will deflect the individual laser beams of the emitted laser ray beam with the respectively same rotational sense as well as parallel to and perpendicular to the common plane, the deflection mirror element comprises a plurality of plane-parallel, radiation-transmissive light waveguide strips joined to form a light waveguide strip stack which strips corresponds in number to the plurality of individual laser beams, the thickness of the light waveguide strips is smaller than the first spacing between the laser beams and the light waveguide strips lie parallel to one another and obliquely relative to the common plane of the emitted individual laser beams, the light waveguide strips, in a first end region, are positioned for the individual laser beams to be coupled through a beam infeed face of the light waveguide strip and are allocated to each of the individual beams, every light waveguide strip comprising a light reflection face that follows the beam infeed face in the radiation direction and intersects the beam axis of the respective laser beam, the reflection faces facing toward a second end region of the allocated light waveguide strips lying opposite the first end and deflecting the individual laser beams to the second end region, and the second end region comprises a beam outfeed face through which the individual beams, in turn, emerge from the light waveguide strip.

Advantageously, the light waveguide stack can be manufactured by first providing a plurality of plane-parallel glass strips of different widths, elongated and transmissive to the individual laser beams that correspond in number to the number of laser beams. These are arranged in a stack with one another so that the longitudinal end faces of the glass strip are offset relative to one another at least along one side, so that the glass strip stack exhibits a stair-step shape. The glass strips are subsequently sawn into narrow strips at an angle of approximately 45° relative to one of the longitudinal end faces.

It is inventively provided in the laser component of the above-mentioned species that the deflection mirror element comprises a plurality of plane-parallel, radiation-transmissive light waveguide strips combined to form a light waveguide strip stack of a number of strips corresponding in number to the plurality of individual laser beams. The thickness of these light waveguide strips is smaller than the first spacing between the individual laser beams. The light waveguide strips lie parallel to one another and obliquely relative to the common plane of the individual laser beams. One light waveguide strip in whose first end region the appertaining individual laser beam is coupled in through a beam infeed face of the light waveguide strip is allocated to each individual laser beam.

Each light waveguide strip comprises a reflection face following the beam infeed face in the radiation direction that intersects the beam axis of the respective individual laser beam. This reflection face extends toward the second end region of the respective light waveguide strip lying opposite the first end region and will deflect the individual laser beam toward the second end region. The second end region comprises a beam outfeed face through which the individual laser beam in turn emerges from the light waveguide strip.

As a result of the beam guidance within the light waveguide strips, the radiation losses in the inventive deflection mirror are clearly lower compared to the traditional devices of the above-mentioned species.

The lateral faces of the light waveguide strips now present parallelograms in a plan view and are provided as reflection faces which can be coated with a reflection-enhancing material before or after sawing. In the above-described case, the short end faces of the light waveguide strips describe an angle of 45° with the sawn surfaces provided as reflection faces.

In order to improve the light-guiding properties of the light waveguide strips, adhesive layers having a lower refractive index than the material of the light waveguide strips are preferably arranged between the light waveguide strips, and these adhesive layers connect the light waveguide strips to one another. Given light waveguide strips of glass, silicone adhesive is preferably employed for the adhesive layers.

In an especially preferred embodiment, the laser array is a laser diode bar that is secured on a carrier plate with a planar mounting surface. A laser beam collimation optics, for example a cylinder lens, is arranged on the mounting surface between the laser diode bar and the deflection mirror element in order to parallelize the individual laser beams emitted by the laser diode bar that are highly divergent perpendicular to the common plane. The light waveguide strip stack has its step edges lying on the mounting surface so that the light waveguide strips lie obliquely relative to the common plane of the individual laser beams.

In an especially preferred development of the laser component, all plane-parallel light waveguide strips are of the same width and same thickness and exhibit a shape of a parallelogram in a plan view. However, the light waveguide strips of the stack have different lengths in the direction of the longitudinal axis of the light waveguide strip stack. The light waveguide strips terminate flush on three sides of the light waveguide strip stack and are arranged above one another so that the light waveguide strip stack exhibits a step-shape on one side. The end faces of the steps, which are fashioned as reflection faces, are offset relative to one another along the longitudinal axis of the light waveguide strip stack by the spacing between the individual laser beams. The end faces of the strips lying opposite the steps are likewise fashioned as reflection faces.

In addition to the above-mentioned advantages of the lower radiation losses, over and above this, the inventive laser component can be manufactured with comparatively little outlay in that, first, a plurality of plane-parallel light waveguide strips corresponding in number to the plurality of individual laser beams and having different widths, being elongated and being transmissive to the laser radiation are stacked on top of one another so that the longitudinal end faces of the light waveguide strips terminate flush at one side, for example lying on the same plane. At the side lying opposite this one side, the longitudinal end faces are offset so relative to one another that the stack exhibits a stair-stepped shape. The stack is then sawed, for example at an angle of 45° relative to the longitudinal end face, into narrow stack strips that then essentially already represent the desired deflection mirror elements in the form of light waveguide strip stacks.

Other advantages and features of the invention will be readily apparent from the following description of the preferred embodiments, the drawings and claims.

BRIEF DESCRIPTION OF THE DRAWINGS

FIG. 7 is a schematic illustration of the shaping of the laser beam with the deflection mirror element according to the exemplary embodiment; and FIGS. 8a and 8b are schematic illustrations of the method of manufacturing of the deflection mirror element according to the exemplary embodiment with FIG. 8a being an end view of the stack of the strips being joined together and FIG. 8b being a plan view of the stack after being joined together and showing the paths for sawing.

DESCRIPTION OF THE PREFERRED EMBODIMENTS

Figure 1:
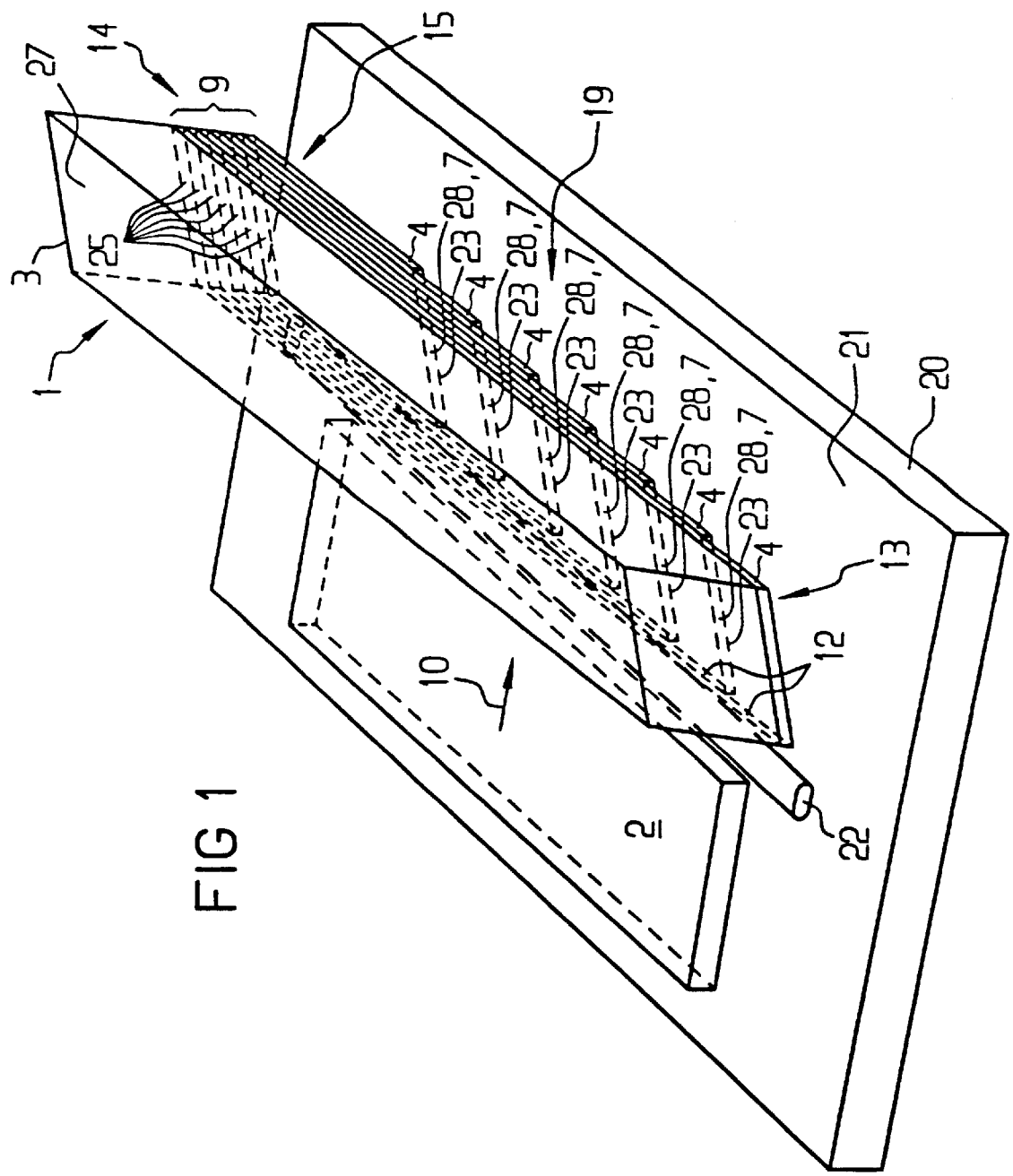
FIG. 1 is a schematic perspective view of an exemplary embodiment of the present invention.
Figure 2:
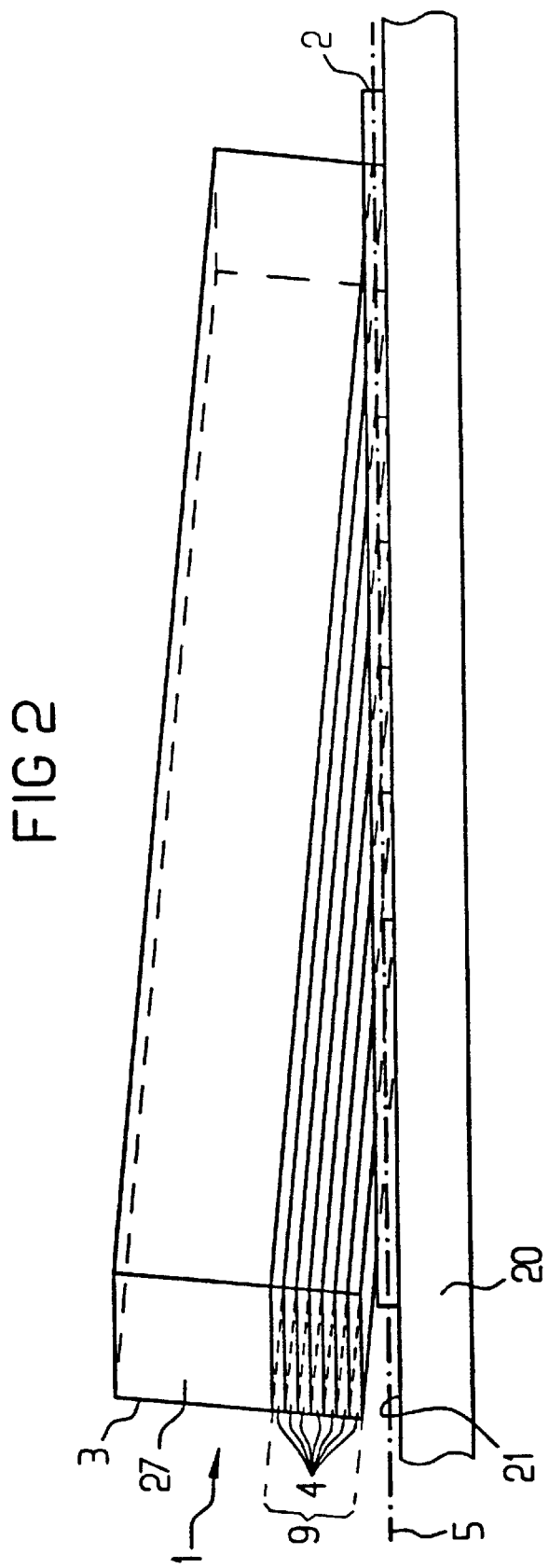
FIG. 2 is a first side view of the exemplary embodiment of FIG. 1.
Figure 3:
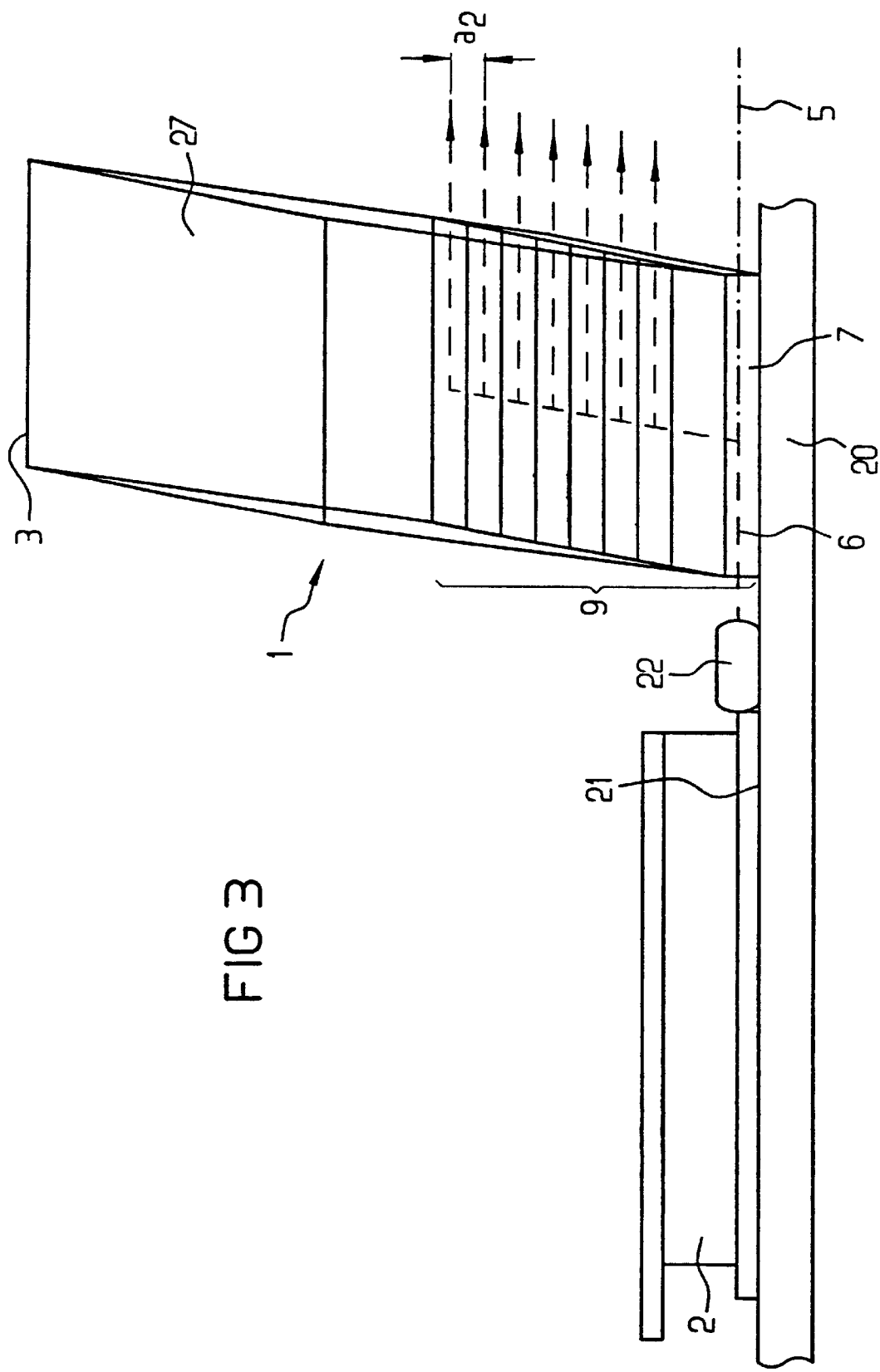
FIG. 3 is an end view of the exemplary embodiment of FIG. 1.

The principles of the present invention are particularly useful for showing a laser component, which is generally indicated at 1 in FIGS. 1–4. The laser component 1 includes a laser diode bar 2, which is secured on a mounting surface 21 of a carrier plate 20. This laser diode bar 2 emits a plurality of individual laser beams having beam axes 6 lying in a common plane 5 (see FIG. 3) and comprising a first spacing al (see FIG. 4) from one another. The common plane 5 lies essentially parallel to the mounting surface 21 of the carrier plate 20, as best shown in FIGS. 2 and 3.

In this specific instance, the laser diode bar 2, for example a high-performance laser diode bar, comprises seven strip-shaped pn-junctions that lie in a common plane 5. Each pn-junction emits an individual laser beam having an elliptical cross-section, whose long axis proceeds parallel to the pn-junction and whose short axis proceed perpendicular thereto. The emitted laser beam therefore has an extremely elongated cross-sectional shape. The individual laser beam exhibits a great divergence perpendicular to the common plane 5 and a small divergence in the area extending parallel to the plane 5.

In the radiation direction 10 (FIG. 1), the device 1 has a cylindrical lens 22 for collimation of the individual laser beams emitted by the laser diode bar 2 perpendicular to the common plane 5 of the laser diode bar 2. The cylindrical lens is followed in the radiation direction 10 by a deflection mirror element 3 that comprises a plurality of plane-parallel light waveguide strips 4 that, for example, are composed of glass and that correspond in number to the plurality of individual laser beams.

Figure 5:
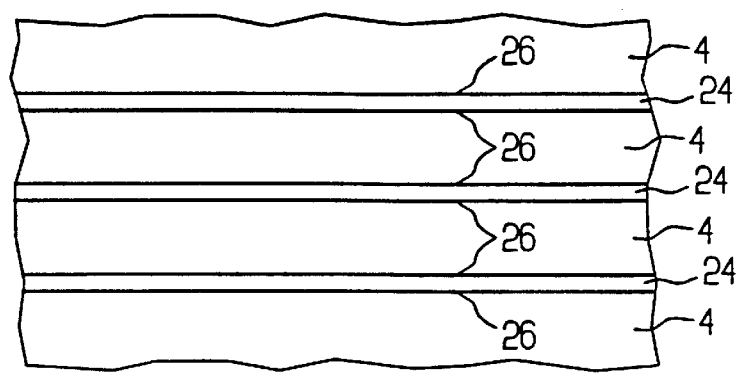
FIG. 5 is an enlarged partial end view of the light waveguide strip stack.

The light waveguide strips 4 have their principal faces 26 lying above one another joined to form a light waveguide strip stack 9, as shown in an enlarged end view of FIG. 5. The strips 4 are connected to one another with adhesive layers 24. The adhesive layers 24 preferably exhibit a lower refractive index than the material of the light waveguide strips 4 in order to improve the light-guiding properties of the light waveguide strips 4. The layers 24 are preferably composed of a silicone adhesive.

As shown in FIGS. 1–4, to stabilize the light waveguide strip stack 9, a carrier strip 27 is applied to the stack 9.

Figure 4:
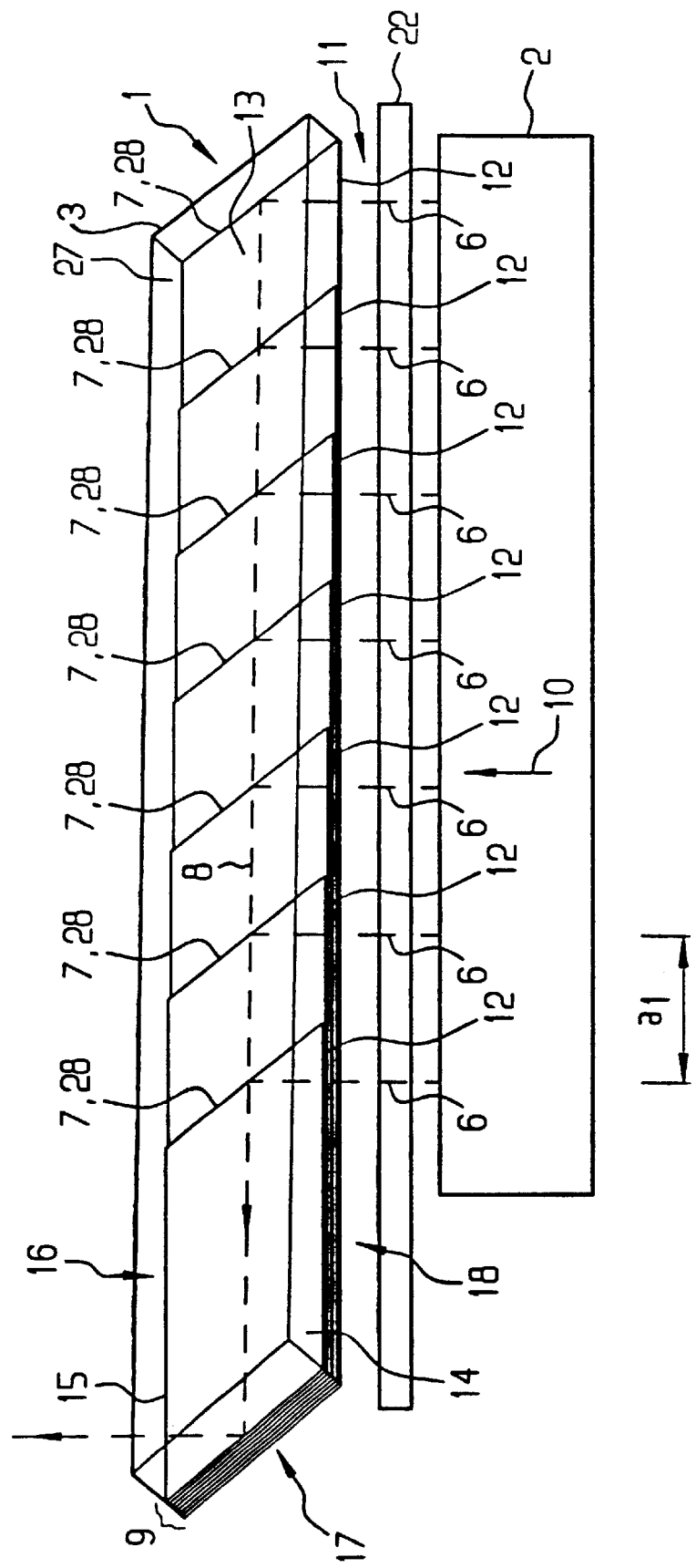
FIG. 4 is a plan view of the exemplary embodiment of FIG. 1.

The light waveguide strips 4 exhibit a shape of elongated parallelograms having inside angles of 45° and 135°. As shown in FIG. 4, the strips 4 terminate flush on three side faces 16, 17 and 18 of the light waveguide stack and are of different lengths.

The short end faces 17 and 28 are preferably provided with a reflection-enhancing layer, for example an aluminum layer. Vapor deposition, sputtering, CVD or some other method known from semiconductor technology can be used as the aluminum coating method.

The light waveguide strips 4 are arranged one above another with respect to their lengths so that the light waveguide strip stack 9 has the shape of stair-steps 19, as shown in FIG. 1, on one end. The light waveguide strip stack 9 has its stepped edges 23 of the stair-step lying on the mounting surface 21 of the carrier plate 20 so that the longitudinal axes 8, as shown in FIG. 4, of the light waveguide strips lie essentially perpendicular to the beam direction 10 of the emitted individual laser beams and obliquely relative to the mounting surface 21. The step height a2 and depth is selected so that each light waveguide strip 4 has a longitudinal end face intersecting the beam axis 6 of an individual laser beam in its first end region 13 facing toward the mounting surface 21 so that the individual laser beam is coupled into the light waveguide strip with optimally low losses.

The short end faces 28 in the first end region 13 of the light waveguide strip 4, i.e., the end face of the stair-steps, are fashioned as first reflection faces 7 and form an angle of 45° with the beam axes 6 in the common plane. These reflection faces 7 are sequentially offset by a spacing a1 relative to one another along the common plane 5.

The reflection faces 7 face toward the second end region 14 of the light waveguide strips 4 which lie opposite the first end region 13 and deflect the individual laser beams toward the second end regions 14. In the light waveguide strip stack 4, consequently, the individual laser beams, as viewed proceeding from the common plane 5, are arranged with their long axes of the first section above one another. The laser ray beam has an essentially rectangular cross-section after the deflection by the reflection faces 7.

The short end faces of the light waveguide strips 4 lying opposite the reflection faces 7 are fashioned as further or additional reflection faces 25, for example by means of a reflection coating. The reflection faces 25 lie in the same plane and intersect the longitudinal axes 8 of the light waveguide strips 4 essentially at an angle of 45° so that each laser beam is again deflected before outfeed from the light waveguide strip stack 9 into the original beam direction 10 of the individual laser beams emitted by the laser diode bar 2.

Figure 6:
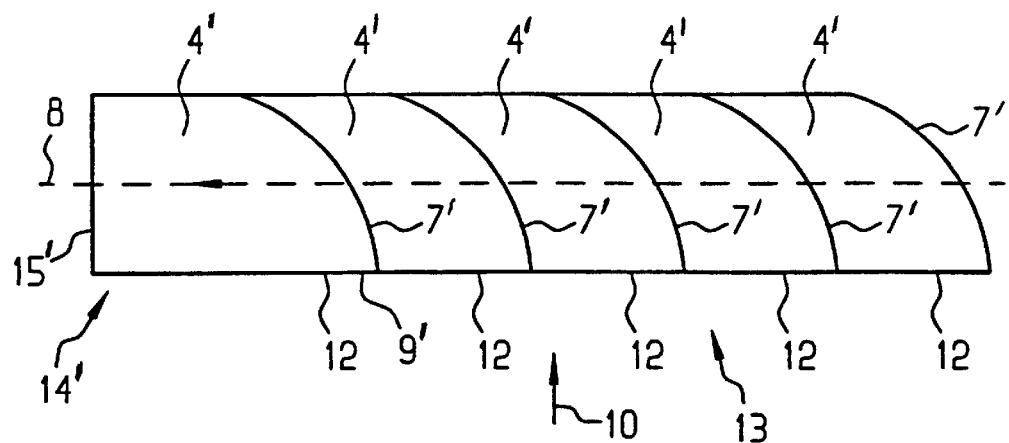
FIG. 6 is an alternative embodiment of the reflection faces of the light waveguide strip stack according to the present invention.

An embodiment of the light waveguide strip stack 9' is shown schematically in FIG. 6 and has the end faces of the stair-steps fashioned as reflection faces 7' which are not flat, but are curved in order to achieve a collimation of the individual laser beams simultaneously with the deflection. In addition, the light waveguide strips 4' here do not exhibit any additional reflection faces in their second end regions 14'. Here, the end faces of the light waveguide strips lying opposite the reflection faces 7' are the beam outfeed faces 15' of the light waveguide strip stack 9'. The beam direction of the shaped laser beam is thus essentially perpendicular to the original beam direction 10 of the laser diode bar.

FIG. 7 schematically shows the shaping of the laser beam 11 with the deflection mirror element 3 according to the exemplary embodiment and the embodiment of FIG. 6. The laser ray beam 11, which is composed of seven collimated individual laser beams 28 having a strip-shaped cross-section which beams 28 are emitted by the laser diode bar 2, is reshaped into an output laser beam 29 having a rectangular cross-section composed of seven individual laser beams 28' arranged parallel side-by-side and arranged in cross-section. This, for example, can then be supplied into an optical fiber or can be utilized for pumping a solid-state laser.

The method for making the deflection mirror element 3 according to the exemplary embodiment is illustrated in FIGS. 8a and 8b. First, seven glass strips 31 of different widths are arranged above one another in a try square or right-angle jig 32 on a Si carrier 30. The width of the glass strips 31 becomes smaller from bottom toward the top. The glass strips are connected to one another with a silicone adhesive. The glass strips 31 terminate flush at a surface of the try square 32 lying parallel to the longitudinal axes of the glass strips 31, so that they form a stair-step 33 at the opposite side, as shown in FIG. 8a.

The end faces of the glass strips 31, that are provided as reflection faces, can be provided with a reflection layer before or after these steps.

Subsequently, the glass strip stack, as shown in FIG. 8b, is sawed or cut into narrow light waveguide strip stacks 9 along sawing lines 37, which are shown in FIG. 8b, and extend at an angle 34 of 45° relative to the longitudinal axes of the glass strips. The sawn surfaces are preferably subsequently polished and can be additionally provided with a layer having a lower refractive index than the glass.

As indicated in FIG. 8a by the broken lines 35, the end faces of the steps can be advantageously slightly slanted. For example, they can exhibit an angle of less than 1° to the surface normal of the principal faces of the glass strips 31 in order to achieve a more exact deflection of the individual laser beams in the direction of the longitudinal extent of the light waveguide strips 4.

The light waveguide strips 4 can be composed, for example, of glass, of transparent plastic or of a semiconductor material that is transmissive for the wavelength λ of the radiation emitted by the laser diode bar 2. For example, SiC is suitable for wavelengths λ>400 nm, GaP is suitable for λ>550 nm, GaAs is suitable for λ>900 nm and Si is suitable, for example, for λ>1100 nm.

Although various minor modifications may be suggested by those versed in the art, it should be understood that we wish to embody within the scope of the patent granted hereon all such modifications as reasonably and properly come within the scope of our contribution to the art.

We claim:

1. A laser component having a laser array and an optical device for reordering the laser beams emitted by the laser array, said laser array emitting at least two individual laser beams with the same first radiation direction and having beam axes extending essentially parallel to one another and lying in a single common plane at a first spacing from one another, the optical device comprising a deflection mirror element following the laser array in a radiation direction that deflects the individual laser beams of the laser array with the respectively same rotational sense as well as parallel to and perpendicular to the common plane, the deflection mirror element comprising a plurality of plane-parallel, radiation-transmissive light waveguide strips being joined in a stacking direction to form a light waveguide strip stack with the number of strips corresponding to the number of individual laser beams, the thickness of the light waveguide strips in the stacking direction being smaller than the first spacing, the light waveguide strips lying parallel to one another and obliquely relative to the common plane of the emitted individual laser beams, the light waveguide strips each having a first end region with the appertaining individual laser beam being coupled in through a beam infeed face of the light waveguide strip allocated to each individual beam, every light waveguide strip comprising a reflection face that follows the beam infeed face in the radiation direction and intersects the beam axis of the respective appertaining individual laser beam, said reflection face facing toward a second end region of the allocated light waveguide strip lying opposite the first end region and deflecting the appertaining individual laser beam to the second end region, and the second end region comprises a beam outfeed face through which the laser beam, in turn, emerges from the light waveguide strip of the stack.

2. A laser component according to claim 1, wherein the individual laser beams of the emitted laser beams essentially exhibit a strip-shaped cross-sectional area, the longitudinal center axes of the cross-sectional areas in the emitted laser beam lie essentially in the common plane, all end faces of the light waveguide strips except the reflection faces terminate flush, and the reflection faces being offset relative to one another by a first spacing perpendicular to the radiation direction and parallel to the common plane so that the light waveguide strip stack exhibits a stair-step shape at one side.

3. A laser component according to claim 2, wherein the longitudinal axis of the light waveguide strip stack proceeds approximately perpendicular to the radiation direction of the emitted laser beam and obliquely relative to the common plane and the reflection faces lie parallel to one another and describe an angle of approximately 45° to the beam axes.

4. A laser component according to claim 3, wherein the laser array is a laser diode bar that is secured on a carrier plate with a planar mounting surface, a beam collimation optics for parallelizing the individual laser beam emitted by the laser diode bar being arranged on the mounting surface between the laser diode bar and the deflection mirror element, and the light waveguide strip stack has its stepped edges lying on the mounting surface.

5. A laser component according to claim 4, characterized in that two neighboring light waveguide strips are respectively connected to one another with an adhesive layer that exhibits a lower refractive index than the material of the light waveguide strips.

6. A laser component according to claim 5, wherein the adhesive layer is a silicone adhesive.

7. A laser component according to claim 6, wherein each light waveguide strip comprises an additional reflection face in the second end region which, in turn, deflects the individual laser beam toward the original beam direction of the emitted individual laser beams before it leaves the light waveguide strip.

8. A laser component according to claim 7, wherein the plane-parallel, radiation-transmissive laser strips are of the same width and same thickness and exhibit the shape of parallelograms in the plan view with different lengths in the direction of the longitudinal axes of the light waveguide strip stack.

9. A laser component according to claim 2, wherein the laser array is a laser diode bar that is secured on a carrier plate with a planar mounting surface, a beam collimation optics for parallelizing individual laser beams emitted by the laser diode bar being arranged on the mounting surface between the laser diode bar and the deflection mirror element and the light waveguide strip stack having its stepped edge lying on the mounting surface.

10. A laser component according to claim 1, wherein the longitudinal axes of the light waveguide strip stack extends approximately perpendicular to the radiation direction of the emitted laser ray beams and obliquely relative to the common plane of said beams and the reflection faces lie parallel to one another and describe an angle of approximately 45° with the beam axes.

11. A laser component according to claim 1, wherein the two neighboring light waveguide strips are respectively connected to one another with an adhesive layer that exhibits a lower refractive index than the material of the light waveguide strips.

12. A laser component according to claim 11, wherein the adhesive layer is a silicone adhesive.

13. A laser component according to claim 1, wherein each light waveguide strip comprises an additional reflection face in the second end region which, in turn, deflects the appertaining individual laser beam toward the beam direction of the emitted individual laser beam before it leaves the light waveguide strip.

14. A laser component according to claim 13, wherein the plane-parallel, radiation-transmissive light waveguide strips are of the same width and same thickness and exhibit the shape of parallelograms in a plan view with different lengths in the direction of the longitudinal axis of the light waveguide strip stack and the end faces of the light waveguide strips lying opposite the first-mentioned reflection face are fashioned as reflection faces extending at a 45° angle to the longitudinal axis of the light waveguide strips.

15. A method for manufacturing a light waveguide stack for employment in a laser component, said method comprising providing a plurality of plane-parallel glass strips transmissive for the individual laser beams, with the number of strips corresponding to the number of the plurality of individual laser beams, said strips having different widths; stacking the strips one on the other so that the longitudinal end faces of the glass strips are offset relative to one another on at least one side so that the glass strip stack exhibits a stair shape; securing the glass strips together to form a glass strip stack; and subsequently sawing the glass strip stack along two parallel lines extending at an angle of 45° to the one side of the stack to form a narrow strip stack at an angle of approximately 45° relative to a longitudinal end face of the glass strip stack.

* * * * *